(12) United States Patent
Lo et al.

(10) Patent No.: US 7,902,802 B2
(45) Date of Patent: Mar. 8, 2011

(54) SYSTEMS AND METHODS FOR ON-CHIP POWER MANAGEMENT

(75) Inventors: Jien-Chung Lo, West Kingston, RI (US); Chuen-Song Chen, Houston, TX (US)

(73) Assignee: The Board of Governors for Higher Education, State of Rhode Island and Providence Plantations, Providence, RI (US)

( * ) Notice: Subject to any disclaimer, the term of this patent is extended or adjusted under 35 U.S.C. 154(b) by 0 days.

(21) Appl. No.: 12/691,345

(22) Filed: Jan. 21, 2010

(65) Prior Publication Data

US 2010/0148758 A1 Jun. 17, 2010

Related U.S. Application Data

(63) Continuation of application No. PCT/US2007/064463, filed on Mar. 21, 2007.

(60) Provisional application No. 60/789,199, filed on Mar. 27, 2006.

(51) Int. Cl.
*G05F 1/40* (2006.01)
(52) U.S. Cl. .......................... 323/273; 323/280; 324/713
(58) Field of Classification Search .................. 323/273, 323/274, 275, 276, 277, 280, 312–316; 324/771, 324/713
See application file for complete search history.

(56) References Cited

U.S. PATENT DOCUMENTS

| 5,339,349 | A | 8/1994 | Xeno |
| 5,736,877 | A | 4/1998 | Tihanyi |
| 6,781,888 | B1 * | 8/2004 | Horch et al. .................. 323/273 |
| 7,218,082 | B2 | 5/2007 | Walter et al. |
| 7,397,227 | B2 * | 7/2008 | Ke et al. ......................... 323/273 |
| 7,667,449 | B2 * | 2/2010 | Takeda .......................... 323/315 |
| 2004/0242175 | A1 | 12/2004 | Lin |
| 2005/0242796 | A1 | 11/2005 | Yang et al. |

OTHER PUBLICATIONS

US 6,359,518, 03/2002, Aoki (withdrawn)

* cited by examiner

*Primary Examiner* — Jessica Han
(74) *Attorney, Agent, or Firm* — Gauthier & Connors LLP (57) ABSTRACT

A power measurement system is disclosed for use on an integrated circuit for measuring the power used by the integrated circuit. The power measurement system includes a low-dropout voltage regulator and a signal input unit. The low-dropout voltage regulator includes a power transistor that couples a supply voltage to a circuit to be powered by the supply voltage, and the low-dropout voltage regulator provides an internal adjustment signal ($V_{sen}$) for adjusting the internal resistance of the power transistor. The signal input unit receives the internal adjustment signal ($V_{sen}$) and provides a power measurement signal responsive to the internal adjustment signal ($V_{sen}$).

20 Claims, 5 Drawing Sheets

SYSTEMS AND METHODS FOR ON-CHIP POWER MANAGEMENT

PRIORITY

This application is a continuation of International Patent Application No. PCT/US2007/064463, filed on Mar. 21, 2007 and claims priority to U.S. Provisional Patent Application 60/789,199 filed on Mar. 27, 2006, all of which are incorporated herein by reference in their entirety.

BACKGROUND

Power consumption is a significant concern in integrated circuits (ICs), and in very high density ICs in particular. Conventional commercial ICs regularly include millions and even billions of transistors, and may consume up to 100 Watts of power. One concern is that the heat generated may destroy the IC itself. For certain ICs, the concern is also about the power to performance ratio: the performance must be guaranteed with respect to the acceptable power consumption level, which depends on the packaging and cooling apparatus.

Related to power consumption is the need for longer battery life in hand-held devices, such as cell phones, personal data assistants (PDA), iPods, etc. Typical battery life for a PC Laptop is about 2 to 3 hours, iPod for up to 10 hours and cell phone may last about 48 hours on stand-by mode. To further extend the battery life for such devices, batteries with more capacity are needed, or power consumption must be better managed.

Certain conventional power measurement devices are coupled to an IC and estimate power consumption by measuring the current used by the IC. Certain such devices are not sufficiently able, however, to provide the needed information quickly due to a latency effect in measuring power consumption off-the-chip. Some commercial central processing units (CPUs) manage power consumption by monitoring the IC chip temperature. This is an extremely low-cost approach as the temperature sensor can be easily made on the silicon, but this approach however, will not provide direct and immediate information on the power consumption. This power management technique therefore, may only roughly control the power usage while providing needed CPU performance.

Certain other CPU chips employ continuous and direct power measurement in dynamic power management (DPM). This technique involves monitoring the voltage drop across a segment of the power supply line on-chip. By simply applying Ohm's law, the current usage and thus the power consumption may be easily calculated. One major problem of such approach however, is that the resistance of a power supply line on-chip varies due to temperature and other environmental factors. The resistance must be measured before the power consumption may be measured.

There continues to be a need, therefore, for improved power consumption monitoring capabilities, and for systems and methods for continuously monitoring power consumption by circuitry that is on the same silicon chip as the circuits being monitored.

SUMMARY

The invention provides a power measurement system for use on an integrated circuit for measuring the power used by the integrated circuit. In accordance with an embodiment, the power measurement system includes a low-dropout voltage regulator and a signal input unit. The low-dropout voltage regulator includes a power transistor that couples a supply voltage to a circuit to be powered by the supply voltage, and the low-dropout voltage regulator provides an internal adjustment signal ($V_{sen}$) for adjusting the internal resistance of the power transistor. The signal input unit receives the internal adjustment signal ($V_{sen}$) and provides a power measurement signal responsive to the internal adjustment signal ($V_{sen}$).

In accordance with another embodiment the a low-dropout voltage regulator includes an error amplifier for providing the internal adjustment signal ($V_{sen}$), and the signal input unit determines a current measurement ($I_{dd}$) based on the internal adjustment signal ($V_{sen}$), and estimates a power measurement signal based on the current measurement ($I_{dd}$).

In accordance with a further embodiment the invention provides a method of measuring power used by the integrated circuit. The method includes the steps of receiving an internal adjustment signal ($V_{sen}$) from an error amplifier in a low-dropout voltage regulator that includes a power transistor for coupling a supply voltage to a circuit to be powered by the supply voltage, said internal adjustment signal ($V_{sen}$) for adjusting the internal resistance of the power transistor; and providing a power measurement signal responsive to the internal adjustment signal ($V_{sen}$).

BRIEF DESCRIPTION OF THE DRAWINGS

The following description may be further understood with reference to the accompanying drawings in which.

The drawings are shown for illustrative purposes only.

DETAILED DESCRIPTION

The invention provides a system and method that permits on-chip continuous power consumption measurement. The process does not require constant calibration and may be employed using relatively few components by taking power consumption measurements directly from the power source, typically in the form of a voltage regulator on an integrated circuit (IC) chip.

Figure 1:
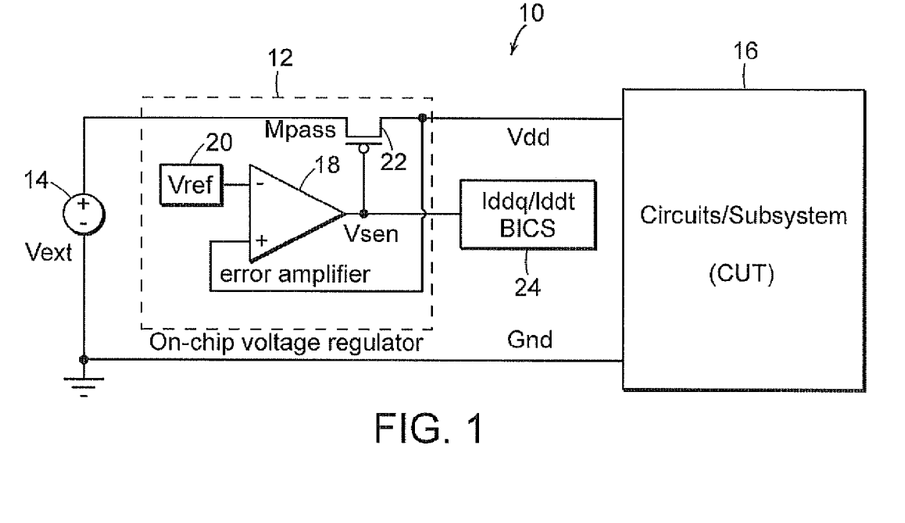
FIG. 1 shows an illustrative diagrammatic view of a power management system in accordance with an embodiment of the invention.

FIG. 1 shows a diagrammatic view of an on-chip power consumption measurement system 10 in accordance with an embodiment of the invention. The system 10 employs the on-chip low-drop-out voltage regulator 12 that couples the external supply voltage 14 to the circuits/subsystems 16 being powered on the chip. The on-chip voltage regulator 12 includes an error amplifier 18 whose negative input is coupled to a reference voltage 20, and whose positive input is feedback coupled from its output. The output of the amplifier 18 is also coupled to the gate of a power transistor 22 whose source is coupled to the supply voltage 14 and whose drain is coupled to the circuits/subsystems 16 being powered on the chip. The on-chip power consumption measurement system 10 includes a power sensor unit 24 that detects quiescent current information over time from the low-drop-out voltage regulator 12.

The system therefore, reuses the existing low-dropout voltage regulator (LDO) and obtains the power information from the LDO's internal signal. LDO's have been commonly used in high-performance IC to help provide desired voltage level in various regions of an IC. It has been observed that a voltage regulator is operated on current-load information, and power consumption may be measured by monitoring the operation of such on-chip voltage regulators.

The low-dropout voltage regulator are widely used in power management, and are well suited for applications that require low-noise and precision supply voltages such as laptops, cellular phones, PDAs, etc. On-chip LDOs may be used, for example, to power up sub-blocks of a system individually, and this may significantly reduce crosstalk, improve the voltage regulation, and eliminate load-transient voltage spikes from the bondwire inductances.

Figure 2:
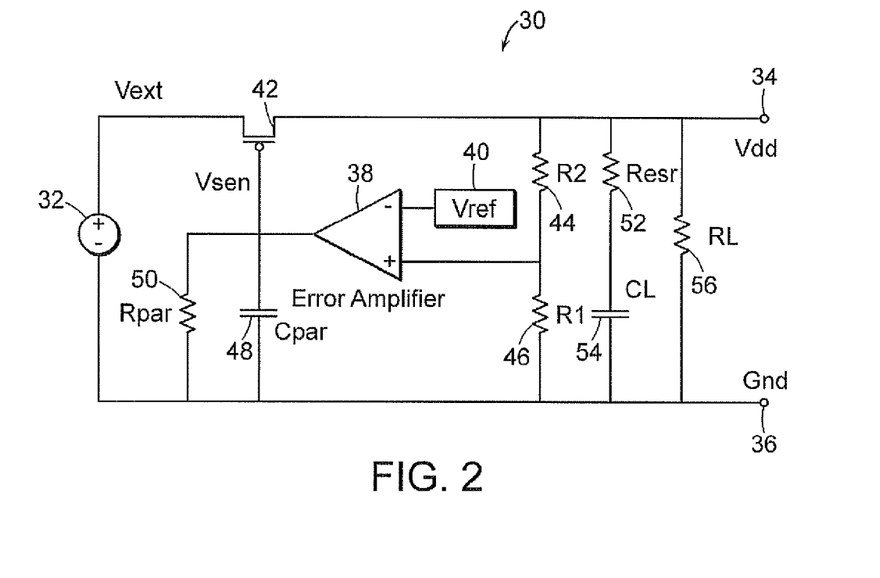
FIG. 2 shows an illustrative diagrammatic view of low drop-out voltage regulator in accordance with an embodiment of the invention.

FIG. 2 shows a LDO voltage regulator circuit 30 in for use in a system in accordance with a further embodiment of the invention. The regulator circuit 30 couples the external supply voltage 32 to circuit voltage source node ($V_{dd}$) and ground node (Gnd) nodes 34, 36 respectively. The regulator circuit includes an error amplifier 38 whose negative input is coupled to a reference voltage 40, and whose positive input is coupled to a junction node in a resistor divider between a first resistor 44 (R2) coupled to the drain of a PMOS power transistor 42, and a second resistor 46 (R1) coupled to the ground node (Gnd). The output of the amplifier 38 is coupled to the gate of the power transistor 42 whose source is coupled to the supply voltage 32 and whose drain is also coupled to the circuit voltage source node ($V_{dd}$). The output of the amplifier 38 is also coupled to a capacitor 48 (Cpar), the other side of which is coupled to ground, and is further coupled to a resistor 50 (Rpar), the other side of which is also coupled to ground. The circuit also includes a resistor 52 (Resr) and load capacitor 54 ($C_L$) that are connected in series between the voltage source node ($V_{dd}$) and ground, as well as a load resistor 56 ($R_L$) that is coupled between the voltage source ($V_{dd}$) and ground.

As shown in FIG. 2, the output node of an LDO regulator is the drain of the PMOS power transistor 42 and the dropout voltage required in this configuration is the overdrive voltage required to keep the PMOS transistor in the saturation region. An error amplifier is used to sense the voltage difference between $V_{dd}$ and $V_{ref}$ and the feedback network regulates the voltage $V_{dd}$ to remain at a constant voltage level. All voltage regulators have an internal signal ($V_{sen}$) to adjust the internal resistance of the power transistor to any occurring current load change. Many further voltage regulator designs are available.

The following analysis of the use of the $V_{sen}$ voltage from such LDO voltage regulators may be applied to many different types of conventional voltage regulators that provide a $V_{sen}$ voltage.

Since $V_{sen}$ adjusts the internal resistance of the power transistor ($M_{pass}$) to any occurring current load, the current information ($I_{dd}$) may be obtained from $V_{sen}$. For a long channel device, the behavior of an $M_{pass}$ transistor may be characterized by a square law equation. Depending on its operation region, the relation between $I_{dd}$ and $V_{sen}$ may be expressed by $$I_{dd} = \frac{1}{2}\beta(V_{ext} - V_{sen} - |V_{tp}|)^2, \qquad (1)$$

for operations in saturation region, or $$I_{dd} = \beta[(V_{ext} - V_{sen} - |V_{tp}|)(V_{ext} - V_{dd}) - (V_{ext} - V_{dd})^2/2], \qquad (2)$$

for operations in the linear region, where $$\beta = \mu_p C_{ox} \frac{W}{L},$$

where $\mu_p$ is the mobility of holes near the silicon surface, and where $C_{ox}$ is the gate capacitance per unit area.

For a short channel device, the alpha-power law MOSFET model is the most widely utilized compact drain current. According to the alpha-power law model, the current in the saturation region is given by $$I_{dd} = P_C \frac{W_d}{L_d}(V_{ext} - V_{sen} - |V_{tp}|)^\alpha \qquad (3)$$

and in the linear region, the current is $$I_{dd} = \frac{P_C W_d}{P_V L_d}(V_{ext} - V_{sen} - |V_{tp}|)^{\frac{\alpha}{2}} V_{DS}. \qquad (4)$$

The values $P_C$ and $P_V$ are technology dependent constants that characterize the drive current of the transistor in the saturation and linear regions. The values $W_d$ and $L_d$ are the geometric width and length, respectively, of the device, and $V_{tp}$ is the threshold voltage of the device. The value α is a constant between one and two, and is equal to two for long channel devices but decreases in magnitude to one due to velocity saturation as the channel length becomes shorter.

Figure 3A:
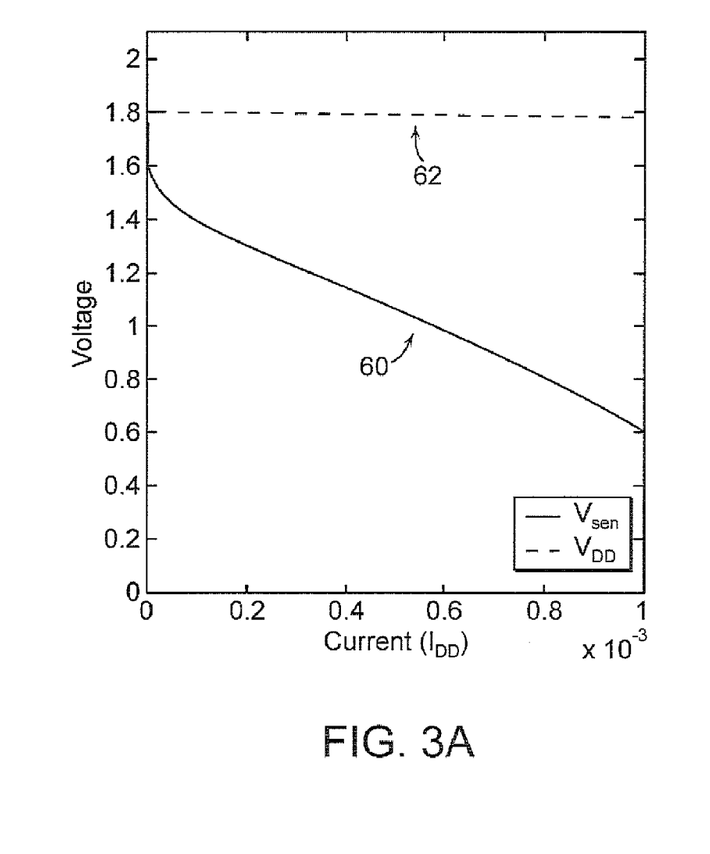
FIGS. 3A and 3B show illustrative graphical views of the DC response of the internal resistance adjustment signal ($V_{sen}$) with respect to varying of current flow ($I_{dd}$) for the linear and saturation areas of the pass element respectively.
Figure 3B:
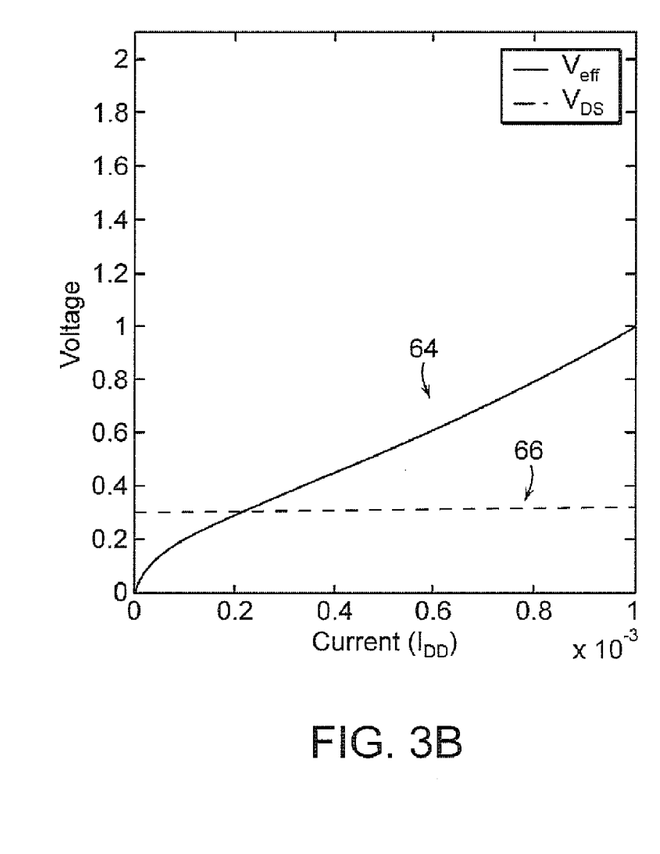

FIG. 3A shows at 60 and 62 respectively the DC response of $V_{sen}$ and $V_{dd}$ with respect to varying current flow ($I_{dd}$) for a first linear region of operation of the pass element. FIG. 3B shows at 64 and 66 respectively the DC response of $V_{sen}$ and $V_{dd}$ with respect to varying current flow ($I_{dd}$) for a second saturation region of operation of the pass element. The PMOS pass transistor becomes a voltage-controlled current source in the saturation region. In the linear region, the series pass element acts like a series resistor with small resistance. If the power consumption does not exceed the design specification, $V_{dd}$ can be regulated at an almost constant voltage. Even $V_{dd}$ however, has very small voltage drop, and $V_{sen}$ is observable and sensitive to small $I_{dd}$ changes.

Figure 4:
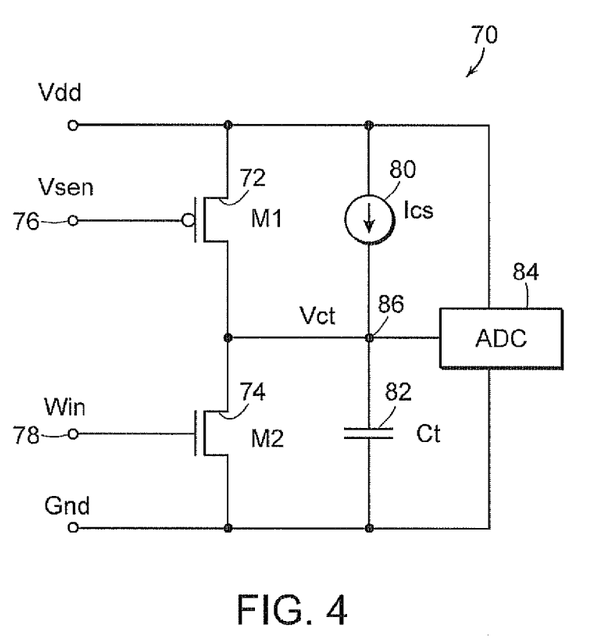
FIG. 4 shows an illustrative diagrammatic view of an on-chip power sensor circuit design in accordance with an embodiment of the present invention.
Figure 5:
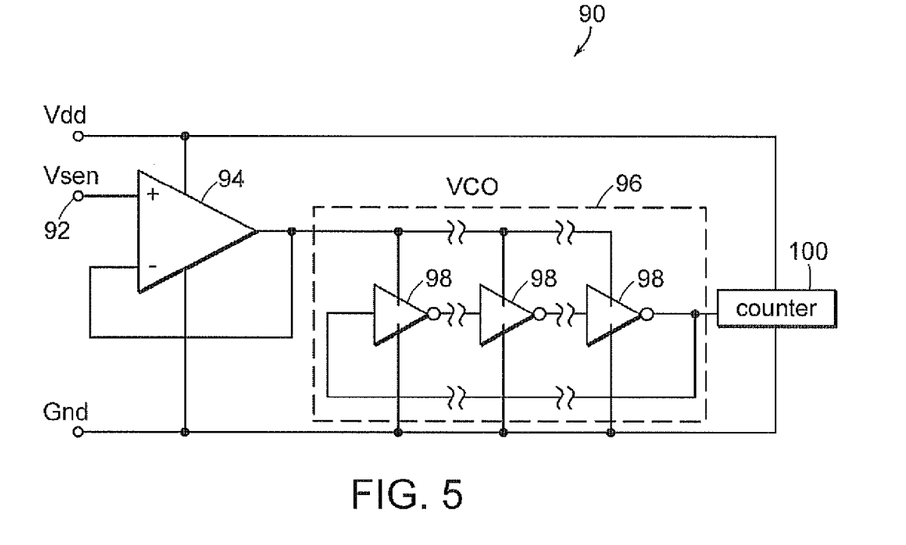
FIG. 5 shows an illustrative diagrammatic view of an on-chip power sensor circuit design in accordance with another embodiment of the present invention.

FIGS. 4 and 5 show diagrammatic views of two on-chip power sensor circuit designs 70 and 90 respectively in accordance with various embodiments of the invention. The power sensor circuit design 70 includes first a PMOS transistor 72 (M1) that is coupled in series with an NMOS transistor 74 (M2) between $V_{dd}$ and ground. The voltage $V_{sen}$ is provided as shown at 76 to the gate of the PMOS transistor 72, and a control signal $W_{in}$ is provided as shown at 78 to the gate of the NMOS transistor 74. A precise current source 80 (ICS) is provided for calibration purposes between $V_{dd}$ and a capacitor 82 (Ct). An analog to digital converter 84 is coupled to a common node between the drain of the PMOS transistor 72, the source of the NMOS transistor 74, the output of the current source 80 and the capacitor 82 (the other end of which is coupled to ground).

In this power sensor circuit, $V_{sen}$ is used to turn on the PMOS transistor 72 (M1). During the control signal $W_{in}$ cycle, the PMOS transistor M1 mirrors the system's current flow and charges the capacitor Ct to a higher voltage level ($V_{ct}$) at node 86. The analog-to-digital converter 84 (ADC) samples and digitizes the voltage $V_{ct}$. A precise current source ($I_{cs}$) is designed for calibration purpose. By measuring $V_{ct}$, power information may be obtained based on the following equation.

$$V_{ct} = \int \frac{I(t)}{C} dt \tag{5a}$$

$$P_{avg}\delta T = \int V_{dd}I(t)dt = V_{dd}V_{ct}C \tag{5b}$$

In the power sensor circuit design shown at 90 in FIG. 5, $V_{sen}$ (as shown at 92) is input to a positive input of an amplifier 94 to thereby buffer $V_{sen}$ by an analog buffer. The negative input of the amplifier 94 is feedback coupled from the output of the amplifier 94, and provides power to a voltage-control oscillator (VCO) 96. FIG. 5 shows a generic description of a digital VCO that consists of an odd number of inverters 98 coupled together in series, with the first receiving its input from the last inverter in the series. A counter 100 is coupled to the output of the last inverter in the series.

The exact number of inverters 98 in the series will depend on the particular fabrication technology and the counter resolution. The output frequency of the VCO is sensitive to the supply voltage $V_{sen}$. The counter 100 is used to measure the VCO frequency and to provide the average voltage of $V_{sen}$. As discussed above, $V_{sen}$ is proportional to circuit's current load. The average power consumption may be expressed by the following equations.

$$V_{sen} \alpha I_{dd} \tag{6a}$$

$$V_{sen\text{-}org} \times V_{dd} \alpha I_{dd\text{-}org} * V_{dd} = P_{avg} \tag{6b}$$

Figure 6A:
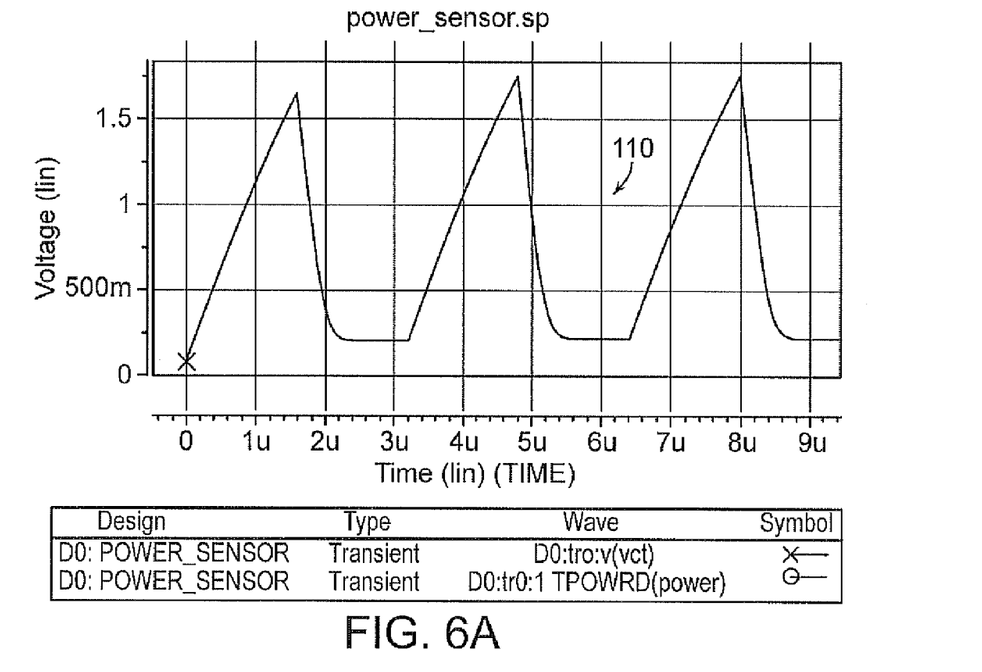
FIGS. 6A and 6B show illustrative graphical views of a simulation of the transient analysis of the output capacitor voltage ($V_{ct}$) and the system's power consumption respectively for the power sensor circuit design shown in FIG. 4.
Figure 6B:
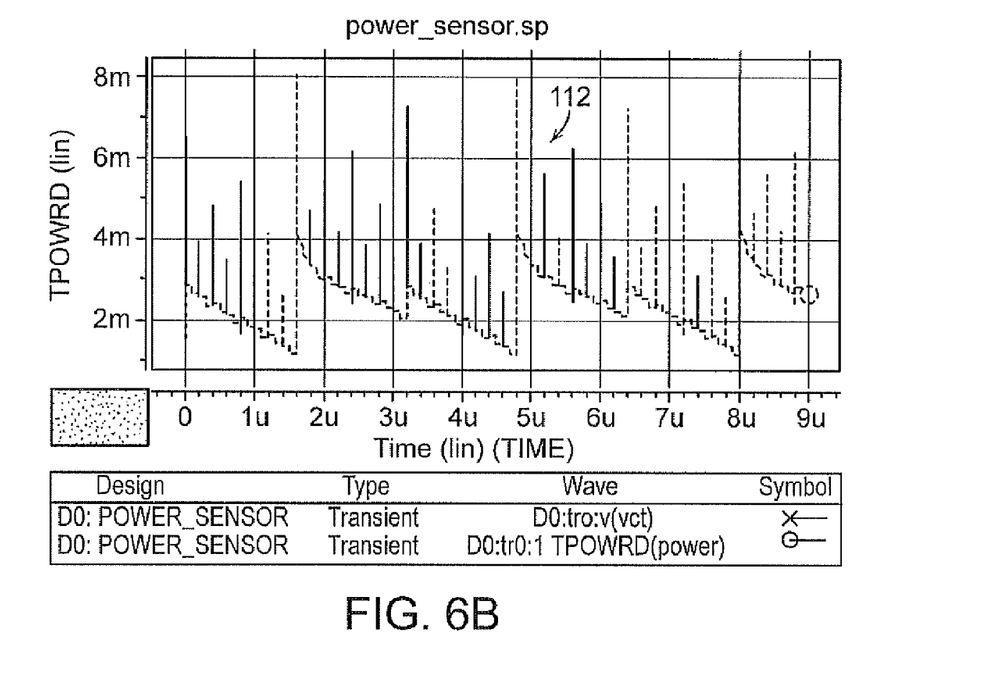
Figure 7:
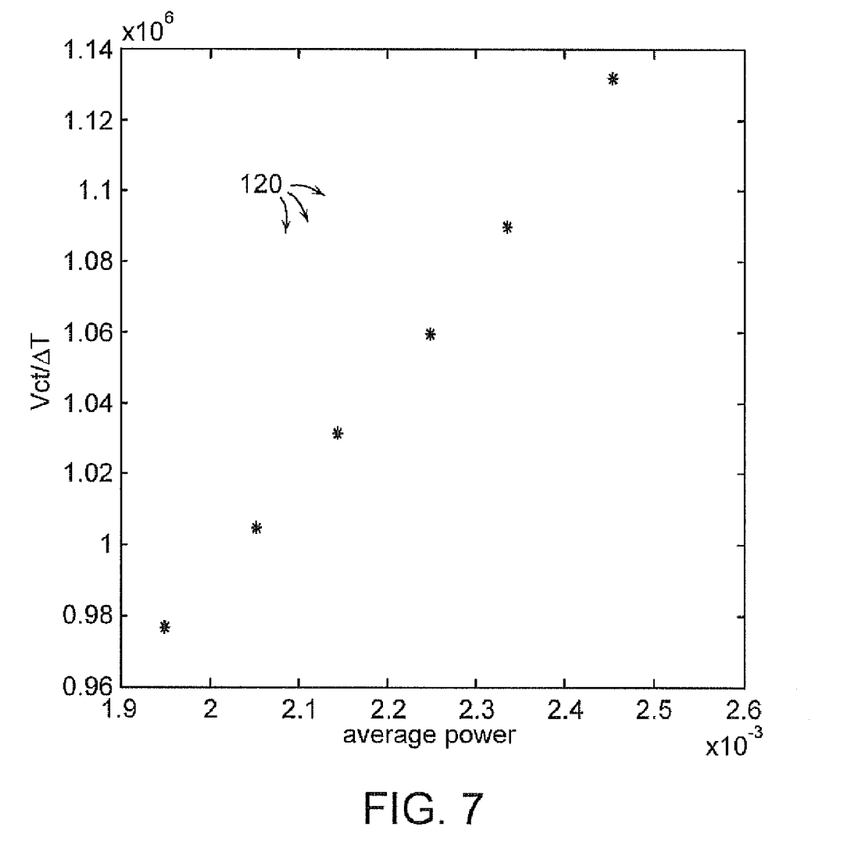
FIG. 7 shows a diagrammatic graphical view of the output capacitor voltage ($V_{ct}$) versus average power consumption for the circuit design shown in FIG. 4 based on the simulations shown in FIGS. 6A and 6B.

FIGS. 6A and 6B show computer simulations of the power sensor circuit design shown in FIG. 4. FIG. 6A shows at 110 the system's transient voltage $V_{ct}$ over time, and FIG. 6B shows at 112 the system's power consumption over time, and the top plot is the transient analysis of $V_{ct}$ voltage. From this simulation, the system's average power consumption may be determined and compared with the $V_{ct}$ voltage. FIG. 7 shows at 120 the average power versus the voltage $V_{ct}$, and verifies that power consumption may be estimated by measuring $V_{ct}$ since the voltage $V_{ct}$ and average power have an approximately linear relationship.

The above on-chip power measurement systems and methods of the invention do not require constant re-calibration. The power measurement may be performed continuously where the measurement is most needed. This is the most important feedback information for any power management technique. The above disclosed design examples may be fabricated easily in most existing IC technologies.

Those skilled in the art will appreciate that numerous modifications and variations may be made to the above disclosed embodiment without departing from the spirit and scope of the invention.

What is claimed is:

1. A power measurement system for use on an integrated circuit for measuring the power used by the integrated circuit, said power measurement system comprising:
   a low-dropout voltage regulator including a power transistor that couples a supply voltage to the integrated circuit as the supply voltage, said low-dropout voltage regulator providing an internal adjustment signal ($V_{sen}$) for adjusting the internal resistance of the power transistor; and
   signal input means for receiving the internal adjustment signal ($V_{sen}$) and providing a power measurement signal responsive to the internal adjustment signal ($V_{sen}$).

2. The power measurement system as claimed in claim 1, wherein said signal input means determines a current measurement ($I_{dd}$) based on the internal adjustment signal ($V_{sen}$) and estimates the power measurement signal based on the current measurement ($I_{dd}$).

3. The power measurement system as claimed in claim 1, wherein said signal input means includes an analog-to-digital converter that samples and digitizes a voltage ($V_{ct}$) that is provided by a capacitor ($C_i$).

4. The power measurement system as claimed in claim 3, wherein said signal input means further includes a first transistor and said internal adjustment signal ($V_{sen}$) is provided to a gate of the first transistor.

5. The power measurement system as claimed in claim 3, wherein said signal input means further includes a current source for calibration.

6. The power measurement system as claimed in claim 5, wherein said current source is coupled to the capacitor.

7. The power measurement system as claimed in claim 1, wherein said signal input means includes a counter that measures a frequency of a voltage controlled oscillator.

8. The power measurement system as claimed in claim 7, wherein said voltage controlled oscillator includes a plurality of inverters.

9. The power measurement system as claimed in claim 7, wherein said internal adjustment signal ($V_{sen}$) is provided to a buffer amplifier, and the voltage controlled oscillator is coupled to an output of the buffer amplifier.

10. The power measurement system as claimed in claim 9, wherein said internal adjustment signal ($V_{sen}$) is provided to a positive input of the buffer amplifier and the negative input of the buffer amplifier is coupled to an output of the buffer amplifier.

11. A power measurement system for use on an integrated circuit for measuring the power used by the integrated circuit, said power measurement system comprising:
    a low-dropout voltage regulator including a power transistor that couples a supply voltage to the integrated circuit to be powered by the supply voltage, said low-dropout voltage regulator also including an error amplifier for providing an internal adjustment signal ($V_{sen}$) for adjusting the internal resistance of the power transistor; and
    signal input means for receiving the internal adjustment signal ($V_{sen}$) determining a current measurement ($I_{dd}$) based on the internal adjustment signal ($V_{sen}$), and estimating a power measurement signal based on the current measurement ($I_{dd}$).

12. The power measurement system as claimed in claim 11, wherein said signal input means includes an analog-to-digital converter that samples and digitizes a voltage ($V_{ct}$) that is provided by a capacitor ($C_i$).

13. The power measurement system as claimed in claim 12, wherein said signal input means further includes a first transistor and said internal adjustment signal ($V_{sen}$) is provided to a gate of the first transistor.

14. The power measurement system as claimed in claim 12, wherein said signal input means further includes a current source for calibration.

15. The power measurement system as claimed in claim 14, wherein said current source is coupled to the capacitor.

16. The power measurement system as claimed in claim 11, wherein said signal input means includes a counter that measures a frequency of a voltage controlled oscillator.

17. The power measurement system as claimed in claim 16, wherein said voltage controlled oscillator includes a plurality of inverters.

18. The power measurement system as claimed in claim 16, wherein said internal adjustment signal ($V_{sen}$) is provided to a buffer amplifier, and the voltage controlled oscillator is coupled to an output of the buffer amplifier.

19. A method of measuring power used by an integrated circuit, said method comprising the steps of:

receiving an internal adjustment signal ($V_{sen}$) from an error amplifier in a low-dropout voltage regulator that includes a power transistor for coupling a supply voltage to the integrated circuit to be powered by the supply voltage, said internal adjustment signal ($V_{sen}$) for adjusting the internal resistance of the power transistor; and providing a power measurement signal responsive to the internal adjustment signal ($V_{sen}$).

20. The method as claimed in claim 19, wherein said step of providing a power measurement signal responsive to the internal adjustment signal ($V_{sen}$) includes the steps of determining a current measurement ($I_{dd}$) based on the internal adjustment signal ($V_{sen}$) and estimating the power measurement signal based on the current measurement ($I_{dd}$).

* * * * *

UNITED STATES PATENT AND TRADEMARK OFFICE
CERTIFICATE OF CORRECTION

| | | |
|---|---|---|
| PATENT NO. | : 7,902,802 B2 | |
| APPLICATION NO. | : 12/691345 | |
| DATED | : March 8, 2011 | |
| INVENTOR(S) | : Jien-Chung Lo and Chuen-Song Chen | |

It is certified that error appears in the above-identified patent and that said Letters Patent is hereby corrected as shown below:

On the title page, under Related U.S. Application Data, item (60); please delete "Provisional application No. 60/789,199" and replace with "Provisional application No. 60/786,199".

In Column 1, under "Priority", please delete "U.S. Provisional Patent Application 60/789,199" and replace with "U.S. Provisional Patent Application 60/786,199".

Signed and Sealed this
Twelfth Day of April, 2011

David J. Kappos
*Director of the United States Patent and Trademark Office*